United States Patent [19]

Legrady

[11] Patent Number: 5,082,460

[45] Date of Patent: Jan. 21, 1992

[54] ELECTRICAL TERMINAL WITH FRANGIBLE MOUNTING LEG AND METHOD OF FORMING THE SAME

[75] Inventor: Janos Legrady, Putnam Valley, N.Y.

[73] Assignee: Zierick Manufacturing Corporation, Mount Kisco, N.Y.

[21] Appl. No.: 636,286

[22] Filed: Dec. 31, 1990

Related U.S. Application Data

[63] Continuation-in-part of Ser. No. 415,964, Oct. 2, 1989, Pat. No. 5,017,159.

[51] Int. Cl.$^5$ ............................................. H01R 13/415
[52] U.S. Cl. ...................................... 439/741; 439/84; 439/870; 29/874
[58] Field of Search .................. 439/83, 84, 741, 870, 439/873, 885; 29/874

[56] References Cited

U.S. PATENT DOCUMENTS 2,811,702 10/1957 Narozny ............................ 439/741
2,914,745 11/1959 Krol et al. ........................ 439/870

FOREIGN PATENT DOCUMENTS 0604251 4/1960 Italy .................................. 439/870

Primary Examiner—Eugene F. Desmond
Attorney, Agent, or Firm—Brooks, Haidt, Haffner & Delahunty

[57] ABSTRACT

A solid single leg terminal includes an electrical conductor end portion at one end and an opposing substantially solid mounting end portion for mounting through a whole other printed circuit board. The mounting end portion forms an elongate mounting leg of substantially uniform cross-section and defines a longitudinal axis. The mounting leg is dimensioned to be substantially fully receivable within the whole from one side of the printed circuit board through to the other side of the printed circuit board. At least one elongate indentation is provided in the mounting end portion substantially parallel to the longitudinal axis to facilitate splitting of the mounting leg along the indentation into two half leg portions and splaying same into abutment against the other side of the printed circuit board to secure the position of the terminal on the printed circuit board. A method of forming the terminals is also described.

20 Claims, 8 Drawing Sheets

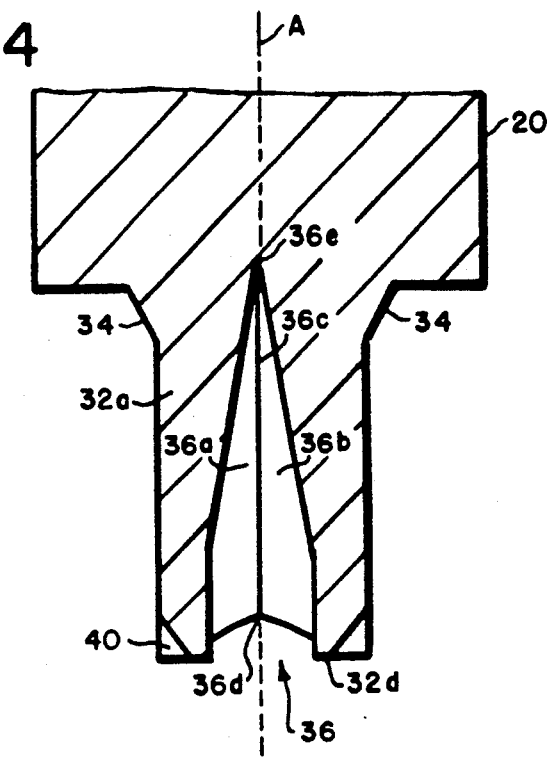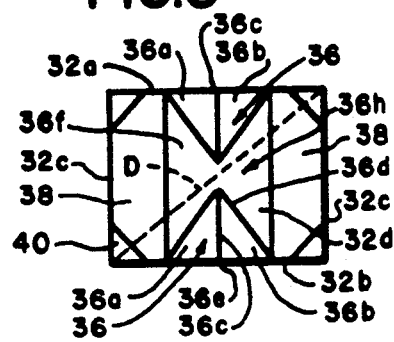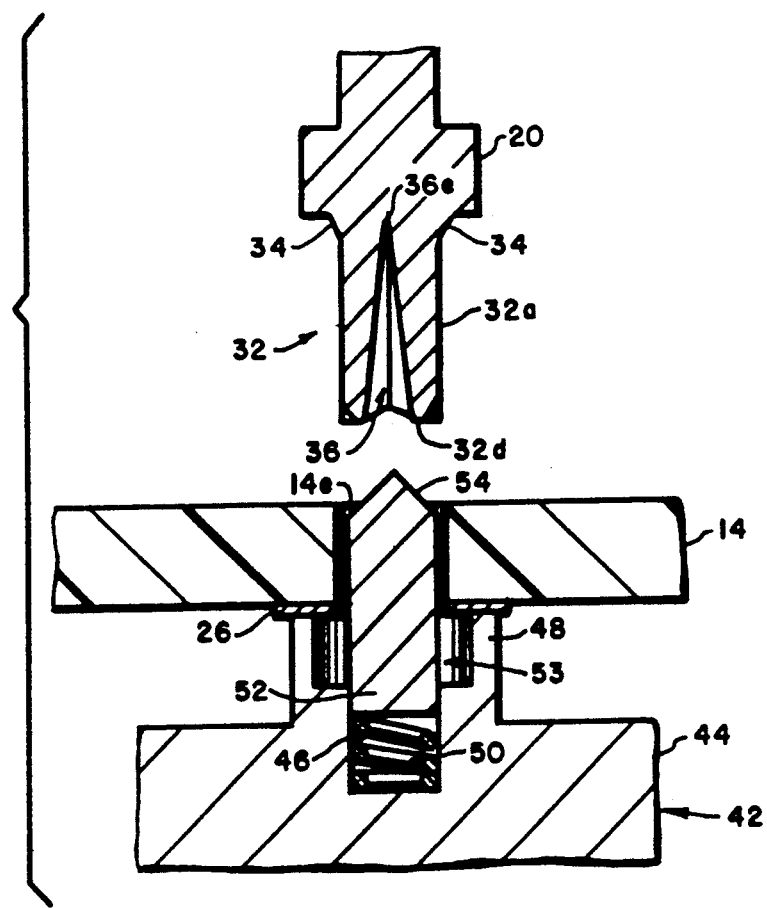

ELECTRICAL TERMINAL WITH FRANGIBLE MOUNTING LEG AND METHOD OF FORMING THE SAME

CROSS REFERENCE TO RELATED INVENTION

This application is a Continuation-In-Part of U.S. patent application No. 07/415,964 filed Oct. 2, 1989, now U.S. Pat. No. 5,017,159.

BACKGROUND OF THE INVENTION

1. Field of the Invention

This invention generally relates to electrical terminals for mounting electrical components on printed circuit (PC) boards and, in particular, to a terminal having a frangible mounting leg suitable for mounting through a mounting hole on a PC board without cutting, deforming or otherwise damaging or effecting the integrity of the PC board.

2. Description of the Prior Art

The conventional way to mount small electrical terminals (like pins and single leg tabs) on a PC board is to force the mounting legs of the terminals into holes on the PC board. The hole diameter is generally smaller than the diagonal or diameter of the mounting leg, so that there is an interference or press fit as shown in FIG. 1. FIG. 2 is an enlarged cross-section of the mounted pin of FIG. 1, showing the interference fit after soldering.

Where a press fit created between the terminal leg and the PC board hole is tight, it produces stresses in the PC board which, if excessive, can crack or warp the board. Also, with a press fit the insertion force may be significant, and this may deform the terminal. An interference fit also frequently produces board material shavings and excessive board material displacement around the hole which make soldering more difficult and can produce a weak solder joint.

A solid single leg terminal is disclosed in U.S. application Ser. No. 07/415,965 filed Oct. 2, 1989, assigned to the assignee of the present application, which is incorporated herein by reference. The aforementioned application discloses a number of prior art approaches which, however, have not proven satisfactory, and an improved design was proposed to overcome the disadvantages of the earlier designs.

However, since the proposed mounting leg has dimensions generally smaller than those of the mounting hole, the mounting leg is received loosely therein and does not always provide lateral or sideway support during the splaying process. It has been found that in some cases splaying does not follow the coin along the center of the leg, but favors one side and results in an asymmetrical one sided splay. Such off center splaying has a tendency to further pull the terminal pin off the original center line perpendicular to the PCB surface. It has also been found that such off center splaying occurs even if the coin is absolutely in the center of the leg. In such cases the splaying tool leaves the coined groove and starts to cut into the side of the leg even if the coin is very deep. Further, such asymmetrical splaying is self fueling. Any propagation in one direction and resulting imbalance of forces on the anvil cause it to move in a direction which accelerates the imbalance. Eventually, in the worst case, the splay runs out of one side of the leg completely shearing it off.

SUMMARY OF THE INVENTION

An object of the present invention is to provide a solid single leg terminal which can be easily and conveniently mounted on a printed circuit board.

It is another object of the present invention to provide a solid single leg terminal which is simple in construction and inexpensive to manufacture.

It is still another object of the present invention to provide a solid single leg terminal which can be mounted without requiring an interference fit within a mounting hole and, therefore, which does not produce stresses, deformations or cracks within the printed circuit board.

It is yet another object of the present invention to provide a solid single leg terminal of the type mentioned in the other objects which can be easily and inexpensively manufactured on continuous carrier strips for use in automated terminal mounting equipment.

It is a further object to provide a terminal which eliminates the need for tight tolerances on the mounting hole diameter and terminal leg size, only requiring tolerances of ±0.006 and larger.

It is still a further object to provide a terminal as above suggested which lowers the solder joint stress level by transferring the forces which act on the terminal body to the PC board material and not to the solder joint.

It is yet a further object to provide a terminal as in the aforementioned objects which results in improved soldering by providing improved solder geometry.

It is an additional object to provide a terminal which resists or eliminates assymetrical splaying of a coined single solid mounting leg.

It is still an additional object to provide a terminal having a coined solid mounting leg of substantially rectangular cross section which assures symmetrical splaying when secured to a PC board within a range of offsets between the center line of the splaying anvil and the center line of the mounting leg in which the coins are provided.

It is also an object to provide a coined single leg terminal which splays like a pre-sheared pin but without the leg being pre-cut into two halves and which is stressed along the coin to insure crack propagation along the coin by the application of a small splaying force.

It is a further object to provide a method for forming the improved solid single leg terminals in accordance with the previous objects.

In order to achieve the above objects, as well as others which will become apparent hereafter, a solid single leg terminal in accordance with the present invention comprises an electrical conductor end portion at one end and an opposing substantially solid mounting end portion for mounting through a hole of a printed circuit board, said mounting end portion forming an elongate mounting leg of substantially uniform cross-section and defining a longitudinal axis. Said mounting leg is dimensioned to be substantially freely receivable within the hole from one side of the printed circuit board through to the other side of the printed circuit board. Two indentations are provided on opposite sides of said mounting leg portions substantially parallel to the longitudinal axis and defining a web of material formed between and bridging said indentations. Said web comprises a frangible line of minimum thickness material. Each of said indentations has a triangular cross-section of decreasing dimensions in the direction of said connector end portion in planes normal to said longitudinal axis.

A method of coining a solid single leg terminal having a rectangular cross-section in accordance with the invention comprises the steps of pre-coining a pair of opposite surfaces of the leg with substantially v-shaped indentations aligned along a line substantially normal to said opposite leg surfaces. The indentations are deepened while supporting the other pair of opposite surfaces to prevent widening of the leg. Said indentations are formed substantially symmetrically about said normal line. The resulting mounting leg is pressed to eliminate or remove any bulging to produce a leg of substantially rectangular cross-section.

BRIEF DESCRIPTION OF THE DRAWINGS

For a more detailed understanding of the manner in which the objects and advantages of the invention may best be achieved, reference will now be had to the following description taken in conjunction with the accompanying drawings, in which:

FIG. 4 is an enlarged front elevational view of the mounting leg and the details of the indentation or coin formed on one side of the mounting leg;

FIG. 5 is a bottom plan view of the mounting leg shown on FIG. 4;

FIG. 6 is a diagramatic view, in front elevation, illustrating a solid single leg terminal in accordance with the invention just prior to mounting on a printed circuit board and the insertion mechanism for securing the terminal to the board;

DESCRIPTION OF THE PREFERRED EMBODIMENTS

Figure 1:
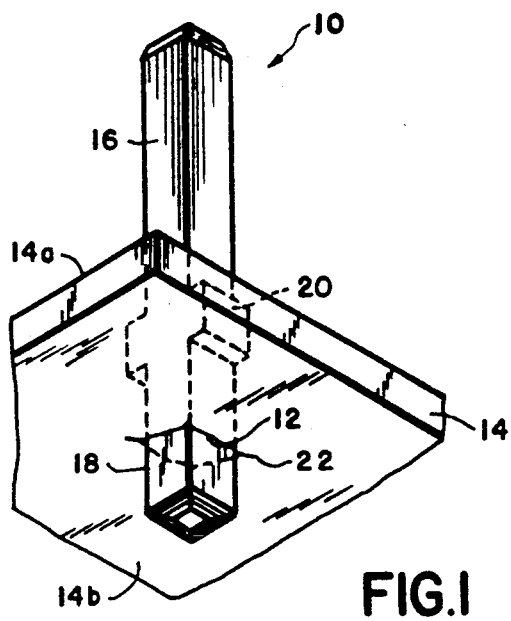
FIG. 1 is a perspective view of a conventional or known solid single leg terminal, illustrating how these terminals have created cracks in the boards in which they have been mounted.
Figure 2:
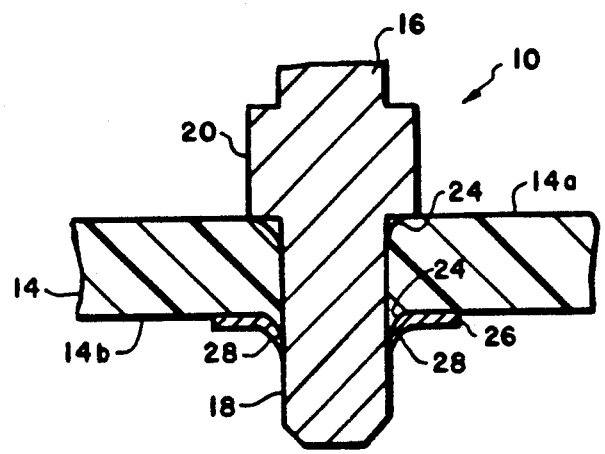
FIG. 2 is an enlarged side elevational view of the terminal shown on FIG. 1, taken in cross section, and illustrating the difficulties in soldering the terminals to the conductive pads as a result of the deformation of the printed circuit board.

Referring now to the Figures, wherein identical or similar parts are designated by the same reference numerals throughout, and first referring to FIGS. 1 and 2, the disadvantages inherent in the use of the prior art solid single leg terminals are illustrated. The reference numeral 10 generally designates a prior art single leg pin-type terminal intended for mounting through a mounting opening 12 within a printed circuit (PC) board 14. The terminal 10 has an upper connecting pin 16 and a lower mounting or insertion leg portion 18. An intermediate or center shoulder, flange or projection 20 may be provided on the terminal 10 which serves as a stop to limit excessive passage through and fix the position of the mounting leg 18 in the opening 12. Typically, the components are mounted on the upper surface 14a of the PC board 14, while the conductive soldering pads or lands are provided on the other or lower surface 14b (not shown). As previously suggested, mounting legs 18 of this type are typically forced into the openings 12 to create a force or interference fit, this creating stresses and deformations within the PC board which can lead to cracks 22, particularly after extended periods of time and under adverse temperature conditions (FIG. 1).

In FIG. 2, an associated problem in the use of such conventional terminals is illustrated where the displacement of material is shown (at 24) which creates a build up of PC board material in the region of the soldering or conductive pads 26. Such build up interferes with the application of solder 28 which may create bad solder joints and decreases the quality of the electrical connections.

Figure 3:
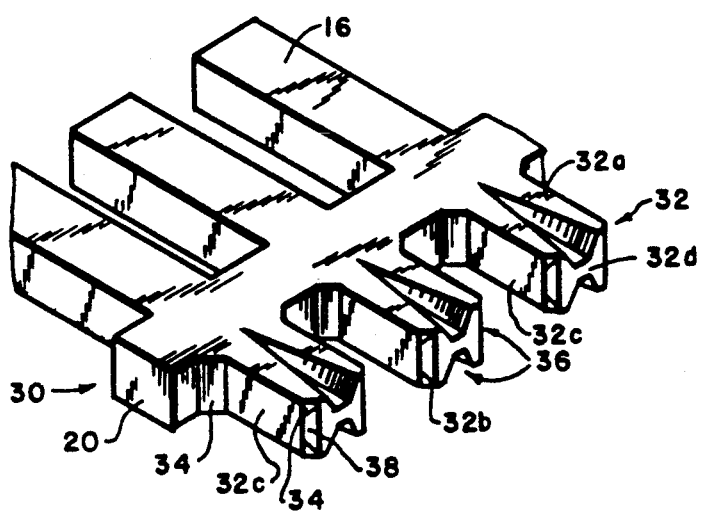
FIG. 3 is a perspective view illustrating the solid single leg terminals in accordance with the present invention mounted on a continuous carrier strip.

Referring to FIG. 3, there is shown a strip 30 of series connected solid single leg terminals connected to each other at the mid-shoulder portions 20 which together form a carrier strip. Each solid single leg terminal 30 includes a mounting leg 32, to be more fully described, which extends to one side of the mid-shoulder portion 20. To each side of the mounting leg 32, there is advantageously provided an upper tapered seat surface 34 which extends between the mounting leg 32 and the mid-shoulder portion 20, for reasons which will be more evident from the discussion of FIGS. 7 and 8.

Each mounting leg 32 includes front and rear surfaces 32a, 32b, side surfaces 32c and lower or bottom surface 32d.

Formed in the front and rear surfaces 32a and 32b are indentations 36 which are in the nature of separation coins, such as by squeezing between two dies substantially parallel to the longitudinal axis of the terminal to facilitate splitting of the mounting leg 32 along the indentations 36, as to be more fully described.

Referring to FIGS. 3-5, the leading end of the mounting leg 32 is advantageously provided with lateral lead-in surfaces 38 and lead-in coins 40 to round out the remote end of the mounting leg to facilitate insertion into a mounting hole of a printed circuit board.

The separation coins 36 are shown in FIG. 5 as being symetrically arranged on opposite sides of the mounting leg 32. Each of the separation coins 36 are formed by two inwardly convergent surfaces 36a, 36b which meet at a frangible joining line 36c which also defines the region of minimum material thickness of the mounting leg. As best shown in FIGS. 3, 4 and 5, each of the coins 36 generally has a triangular cross-section of decreasing dimensions in the direction of the connector end of the portion 16 and can extend into the region of the mid-shoulder portion 20, in planes normal to the longitudinal axis of the terminal. With the coins 36 as shown, the region of minimum material thickness or web is at 36f (FIG. 5) where the two frangible joining lines 36c are the closest. It is at 36f that the mounting leg 32 is the weakest and most susceptible to splitting. Since the frangible joining lines 36c radiate outwardly until they meet the front and rear surfaces 32a, 32b, the uppermost portions 36e of the separation coins 36 are at maximum thickness or at a separation equal to the thickness of the mounting leg 32 itself. Accordingly, the separation coins 36, as arranged and configured, become gradually more rigid from the lower most or end portion 36f to the uppermost portion 36e. In between, the separation coins 36 gradually weaken the mounting leg 32 in the direction of the lowermost end (at 36d).

In accordance with the presently preferred embodiments, the mounting legs 32 have a substantially uniform rectangular cross section, and are dimensioned to be substantially freely receivable within a hole 14e from one side of a PC board through to the other side of the PC board with clearance. In the disclosed embodiments, the mounting legs have substantially uniform cross-sectional configurations along the longitudinal axis or length direction of the terminal. This requires, therefore, that for insertion of the mounting legs within a PC mounting hole of a given diameter, every dimension in the cross section of the mounting leg must be less than the hole diameter, including the diagonals extending between diagonally opposing corners or edges of the mounting leg, as suggested by the dash line D in FIG. 5. In accordance with one design, the thickness of the mounting leg between surfaces 32a and 32b is 0.045 inches (11.4 mm), while the width of the mounting leg between the side surfaces 32c is 0.057 inches (14.5 mm). With this construction, the maximum width of the separation coins (and the plane of the lower surface 34d) is 0.02 inches.

Referring to FIG. 3, the terminals are shown in the form of a continuous strip, as above described. Parts carried from shoulder to shoulder 20, and terminals can be removed from the strip at the time of installation on the PC board by means of automatic or semi-automatic insertion machines. After the terminals are separated from the carrier, the machines line up the terminals with the PC board holes and insert the mounting legs 32 into the holes as will be evident, the terminal pins can also be connected end-to-end and rolled on a spool from which they can be dispensed. In the latter case, each two adjacent terminals are connected at a frangible connecting portion, which is preferably sufficiently flexible to permit the coiling of a string or series of terminals on the spool on which the terminals can be stored.

Figure 7:
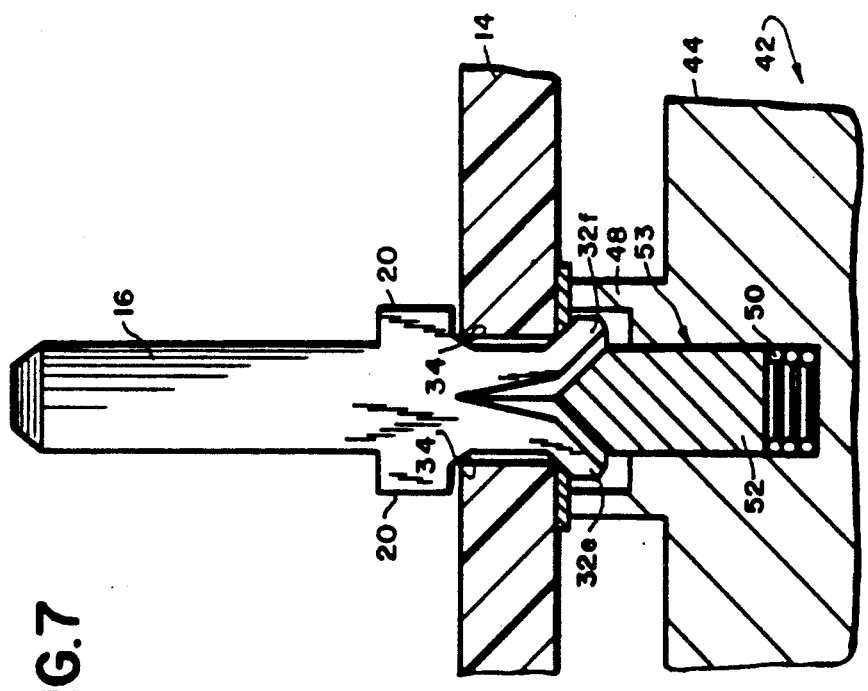
FIG. 7 is similar to FIG. 6, but showing the insertion mechanism and the terminal at the point where the leg has been split and splayed.

The use of the aforementioned solid single leg terminal will now be described in connection with FIGS. 6 and 7. FIG. 6 shows the terminal before insertion into printed circuit board, and FIG. 7 shows the terminal after insertion. The mounting leg 32 is initially aligned with the PC board hole 14e. An insertion mechanism 42 is provided which includes a support block 44 provided with a bore 46 and upwardly extending support arms 48. Positioned within the bore 46 is a compression spring 50 which supports a round shank 52 to form a spring loaded anvil 53 having an upwardly extending wedge-shaped end 54 as shown. The round shank 52 has a diameter which is smaller than the diameter of the printed circuit board hole 14e.

The spring-loaded anvil 53 serves three functions. The round shank 52 helps to locate the PC board hole in the right position. Additionally, the wedge-shaped end 54 splits the mounting leg 32 along the separation coins 36 and splays the two halves of the mounting leg 32 over the soldering pads or conductors 26. In the same figure, the upper tapered seat surfaces 34 are shown as locating surfaces which insure the centering of the mounting leg within the PC board hole 14e.

It is an important feature of the present invention that the solid single leg terminal of the invention is freely received and not supported by an interference fit between the mounting leg 32 and the PC board hole 14e. As above mentioned, the diagonal of the mounting leg is smaller than the diameter of the mounting hole so that there is a loose fit or clearance between the mounting leg 32 and the PC board hole. The terminal sits on the tapered upper seat surfaces 34 on the edge of the hole on the upper side of the PC board. The terminal is held in place securely by the two halves of the mounting leg, which is splayed (formed) outwardly after being split over the lower surface edge of the PC board hole. Since a terminal sits on and is held in place by tapered surfaces on the edge of the hole, the mounting hole diameter can have a much larger tolerance than that required for a press fit-type mounting.

Figure 8:
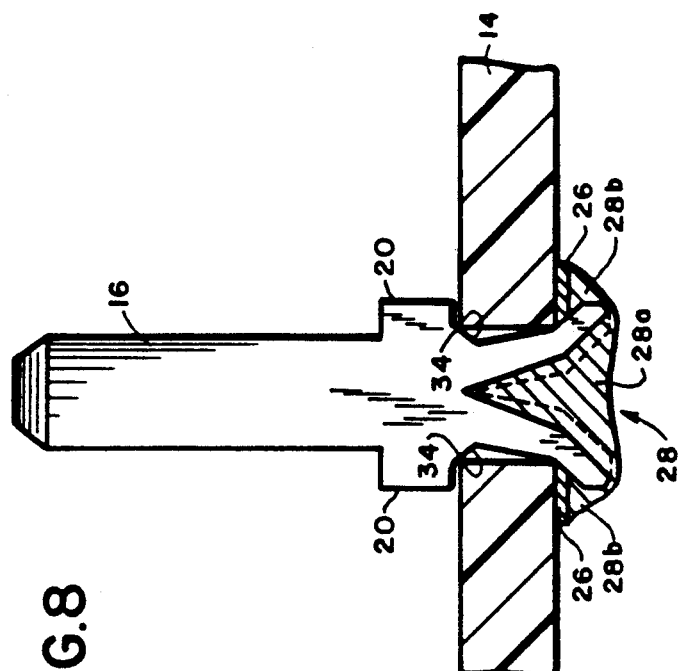
FIG. 8 is similar to FIG. 7, showing the splayed portions soldered to the printed circuit board.

In FIG. 8, solder 28 is shown applied to the underside of the PC board to mechanically and electrically join the split or splayed mounting leg portions 32e and 32f to the conductive lands or soldering pads 26. Since there is no build up of displaced material, as with the prior art arrangements, solder 28 can fill the regions 28a and 28b around the portions 32e, 32f to provide good mechanical and electrical contact. As shown in FIG. 8, during soldering, the melted solder runs up inside the separation coin from the lower surface of the PC board to the upper surface because of capillary action. When the gap between the two halves of the mounting leg fills with solder 28a and the solder hardens, it prevents the splayed leg portions 32e, 32f from moving towards each other or closing in again (from straightening out) when a pulling force is applied to the terminal. This also increases the terminal board anchoring retention. Also, since the leg halves are formed directly over the soldering pad, the solder fills the gap between the leg halves and the pad, increasing the solder area. Unlike an interference fitted pin, there is no displaced PC board material to weaken the solder joint.

Figure 9:
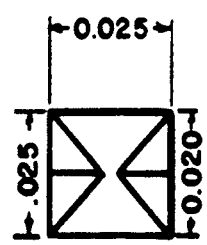
FIG. 9 is similar to FIG. 5, but showing a solid single leg terminal having a different configuration and dimensions in accordance with another embodiment of the invention.

Referring to FIG. 9, another example of a solid single leg terminal is shown, similar to FIG. 5, except that the dimensions are different. Instead of 0.045 inch stock, 0.025 inch stock is used which defines the thickness of the terminal. The width of the mounting leg is 0.025 inches, while the maximum dimension of the separation coins in the planes of the front and rear surfaces 32a, 32b is still 0.020 inches. Clearly, the specific dimensions for the terminal are not critical, as long as the dimensions of the mounting legs 32 satisfy the condition that they can be inserted within a mounting hole of a PC board without an interference fit. However, the rectangular cross-section configuration is the more common design since it is easily aligned and received within a round hole in a PC board.

A significant difference between the solid single leg terminals in accordance with the present invention and those known in the prior art is that by using separation coins, it is normally possible to split a square leg (width of leg equal with the material thickness) into two halves. The prior art mounting legs had to be wider because a pierced slot or a sheared line was needed at the center of the mounting leg to split it in half. However, it is not always possible to shear a square leg in half (lengthwise) by using conventional stamping and insertion machine technology, as will be more fully described hereinafter.

Figure 10:
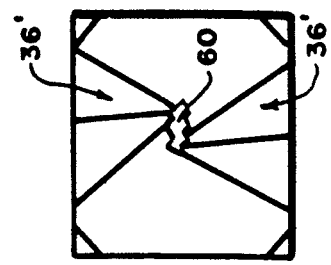
FIG. 10 is similar to FIGS. 5 and 9, but showing still another embodiment in accordance with the invention wherein the coins on the opposite sides of the mounting leg are slightly offset or misaligned from each other.

Referring to FIG. 10, an embodiment is shown wherein the separation coins are slightly off center with respect to each other, so that the separation coins can be made deeper than half of the material thickness, and typically a crack 60 will develop along the coining regions of reduced thickness. This crack in the center of the mounting leg helps to split the leg in half. The separation coin has a very gradual run-out to prevent stress concentration at the end of the coining. The approach suggested in FIG. 10, which has been found to exhibit superior properties, will now be discussed in greater detail.

Figure 11:
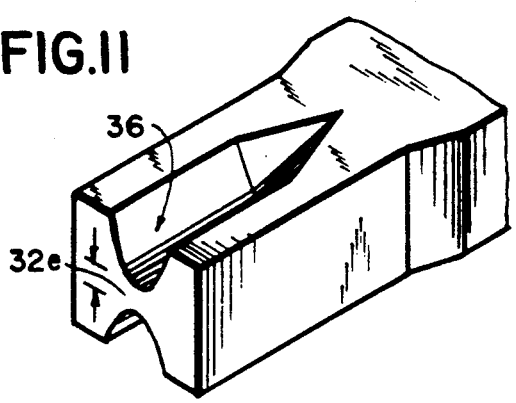
FIG. 11 is a perspective view of a coined mounting leg, illustrating details of the coin.

In developing pin-type terminals with square or slightly rectangular cross-sections (width to thickness ratios of two or less), the goal was to develop a terminal which can be mounted into a PC board with very large hole tolerances (variation in hole diameter), while maintaining excellent retention of the terminal in the PC board. The dimensions of the mounting legs of the terminals must be selected so as not to damage the walls of plated through holes of PC boards, or place any stress on the PC board holes. In order to satisfy these criteria, single leg terminals of the type under discussion are clearly superior since they have the advantage that they can be staked or splayed and have the advantage of being inserted into the PC board holes with a loose fit and thereafter secured to the board by splaying it to provide good retention. However, it has been observed that in the use of terminal mounting legs which are square or substantially square in cross-section with a pair of coins 36 on opposite sides, as in FIG. 11, the mounting leg is not adequately laterally supported during the splaying process due to the desired clearance between the mounting leg and the interior surface of the PC board hole. In order to facilitate insertion and prevent damage to the board, as suggested, there will necessarily be a clearance between the mounting leg and the hole and, therefore the resulting lack of lateral support during splaying.

Figure 12:
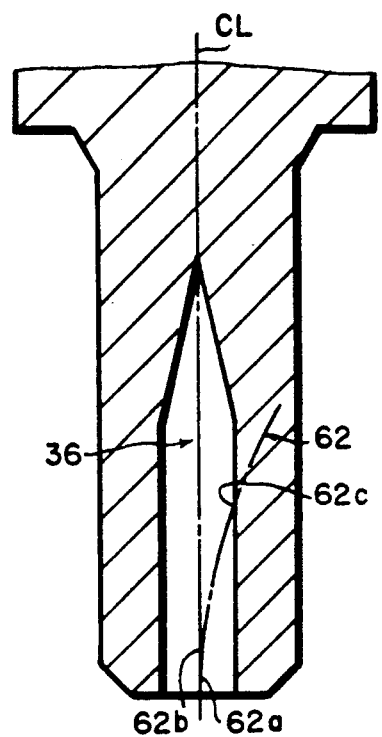
FIG. 12 is a front elevational view of the mounting leg shown on FIG. 11, and illustrating a splaying line which can result with mounting legs of the type shown in FIGS. 1-9 and 11.
Figure 13:
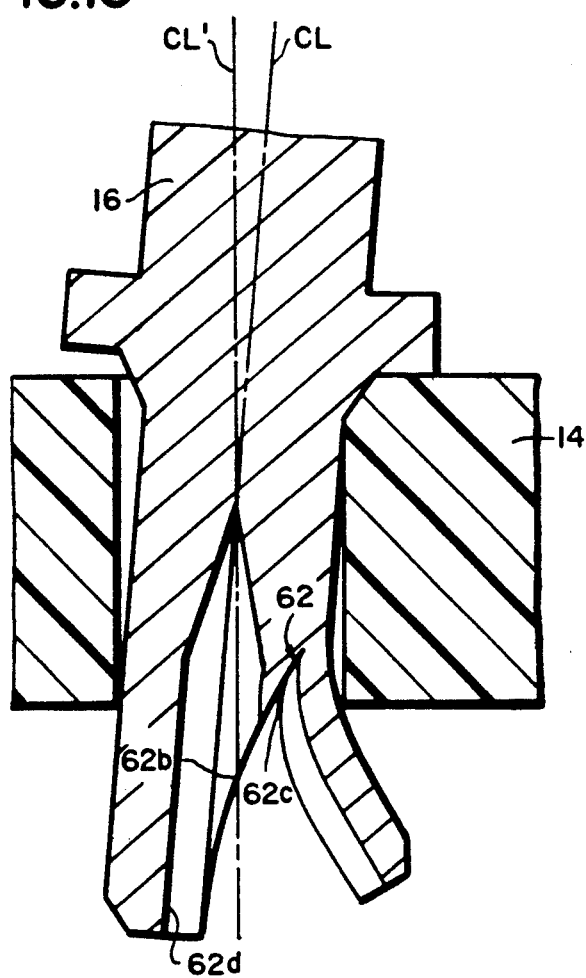
FIG. 13 is a front elevational view of the mounting leg shown in FIGS. 11 and 12, showing how the terminal can tilt relative to the PC board normal direction due to lack of lateral support, resulting in non-symmetrical splays.
Figure 14:
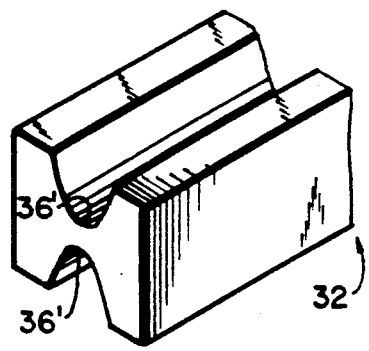
FIG. 14 is similar to FIG. 11, but showing a deeper coin.

Ideally, the anvil 53 (FIG. 7) follows the center line of the coin along the center of the leg. However, it has been found that when the anvil 53 cuts or shears the leg during splaying, it tends to favor one side, producing an asymmetrical one-sided splay, as shown in FIG. 12. In the latter figure, the coin 36 is shown aligned with the center line CL of the mounting leg. Typically, the anvil initially cuts the web 32e (FIG. 11) at a region of initial symmetrical splaying 62a. At some point 62b, the splaying line 62 begins to depart from the center line CL. This normally results from the fact that the mounting leg is not adequately laterally supported and, therefore, the center line of the coin CL is not perpendicular to the surface of the PC board and aligned with the center line of the hole. The splaying line continues to a point 62c which is significantly off center from the center line of the coin. Such off center splaying pulls the terminal pin off from the original perpendicular CL' to the PC board surface (FIG. 13). Tests have shown that such off center splaying occurs even if the coin 36 is absolutely on the center of the leg. It has been found that the splaying tool 53 leaves the coined groove 36 and starts to cut into the side of the leg even if the coin is very deep, as suggested by the coins 36' in FIG. 14. Thus, this undesirable off center splaying cannot be avoided by simply reducing the thickness of the web 32e.

Figure 15:
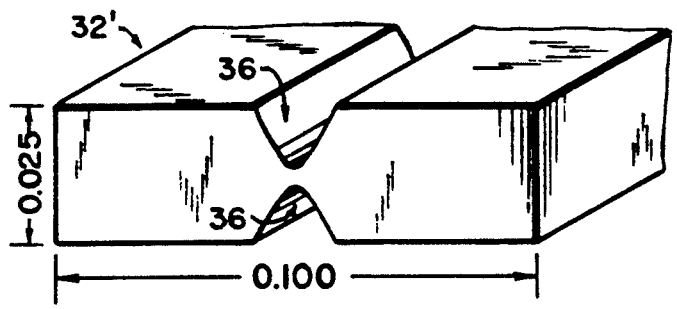
FIG. 15 is similar to FIGS. 11 and 14, but showing a mounting leg which is substantially wider than its thickness to produce a rectangular cross-sectional configuration.
Figure 16:
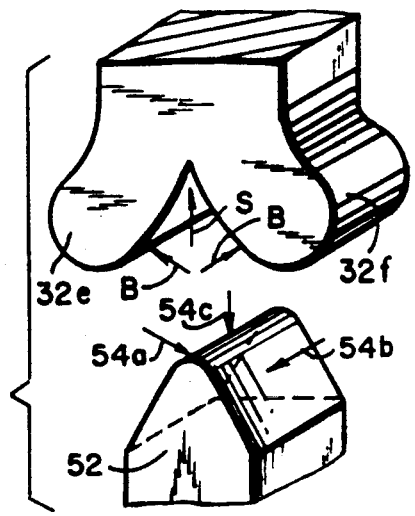
FIG. 16 is a perspective view similar to FIG. 6, showing the relationship between the splaying anvil and the resulting sharing and bending forces which are applied to the mounting leg portions.

The off center splaying phenomenon above suggested occurs only with a square or substantially square cross-section leg, and cannot be duplicated with wider, rectangular cross-section legs of the type shown in FIG. 15, which have a cross-section of 0.025 inches by 0.100 inches. The following stress analysis explains why such off center splaying phenomenon occurs primarily with square legs. Referring to FIG. 16, the splaying force acting on the splaying anvil 52 has three components 54a-54c. This will be evident, the force component 54c on the center is a shearing component, while each of the components 54a and 54b on each side is a bending force component.

Figure 17A:
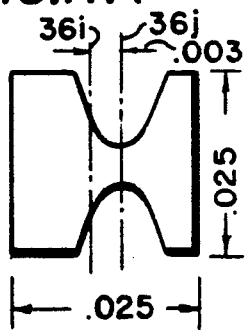
FIG. 17A is a bottom plan view of a generally rectangular mounting leg, showing a relative offset between the center line of the coin and the center line of the leg.
Figure 17B:
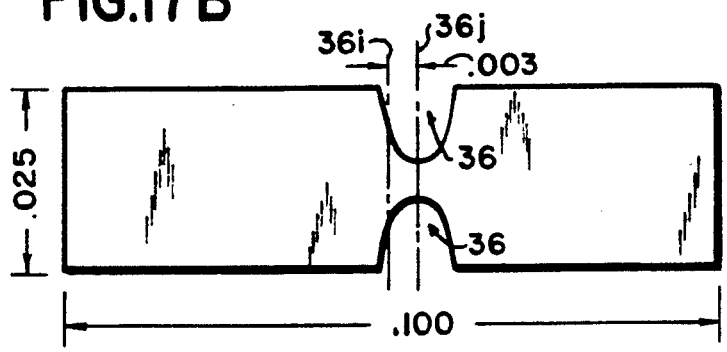
FIG. 17B is similar to FIG. 17A, but showing a wider mounting leg of the type shown in FIG. 15.

To best illustrate the problem a numerical example will be given. The splaying forces of two coined legs are compared. One is a 0.025 square and the other is a 0.025×0.100 wide rectangular leg. Both of them are coined 0.003 inch off from the center line of legs (see FIG. 17A and 17B). The shearing component (force at the center) of the splaying force is same for both legs because the sheared area is same and the bending component is much larger for the wider rectangular leg than the square leg. However, of greatest significance is the very large imbalance of bending force components generated by 0.003 offset on the 0.025 square leg. The required bending moment to bend the leg M is directly proportional with section modulus $Z, M = \delta \times Z$ and $Z = bd^2/6$. Section modulus for smaller leg half $Z, = 0.025 \times 0.0095^2/6 = 0.00000038$ Section Modulus for the larger leg half $Z, = 0.025 \times 0.0155^2/6 = 0.00000094$.

The imbalance of the bending force component is the ratio $0.00000094/0.00000038 = 2.5$. It means that in the case of 0.025 square leg the force required to bend the larger leg half is 2.5 times as great or 150% larger than the force needed to bend the smaller leg half. Same calculations for the 0.100 wide leg are at 0.003 off center $0.025 \times 0.053^2/6 = 0.000012$; $0.025 \times 0.047^2/6 = 0.0000092$ the ratio $0.000012/0.0000092 = 1.27$ so in the case of 0.025×0.100 leg the difference between the large and small leg halves of the leg bending force is only 27%.

Figure 18A:
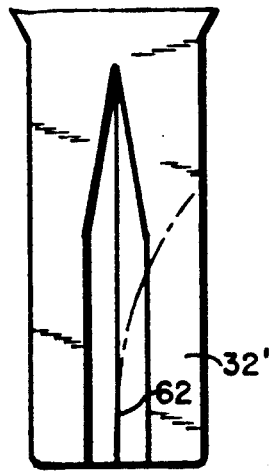
FIGS. 18A and 18B are similar to FIG. 12, and showing the mounting leg which has been asymmetrically splayed, and the leg after a portion of the leg has been sheared off, respectively.
Figure 18B:
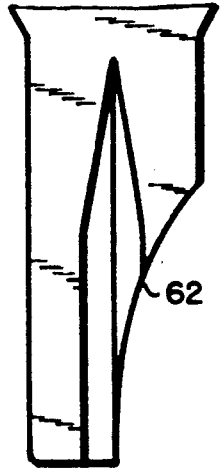

The coin and the splaying anvil are rarely at the center of the leg because of the manufacturing tolerances. The imbalance splaying is not significant with a wider, rectangular leg (only 27% on 0.100×0.025 leg). However, it becomes very significant with a square or close to square cross-section legs (150% on 0.025×0.025 leg). This one-sided splaying is self-fueling. When one half of the leg is smaller, the bending force component on that side is smaller and because of an imbalance the splaying propagates in that direction, causing that side of the leg to get even smaller. This, in turn, makes the imbalance even larger which forces the splay to move even more to the smaller or narrower side. Eventually, in the worst case, the splay will run out on the side of the leg completely shearing it off. Referring to FIGS. 18A and 18B, the splaying path 62 is shown with the portion 32' on the side of the leg which is ultimately sheared off. In this connection, it is pointed out that the anvil 52 has to be small because it is received within the PC board mounting hole, and there is no side support because it is undesirable to apply side forces on the wall of a plated through hole to prevent hole damage.

Figure 19:
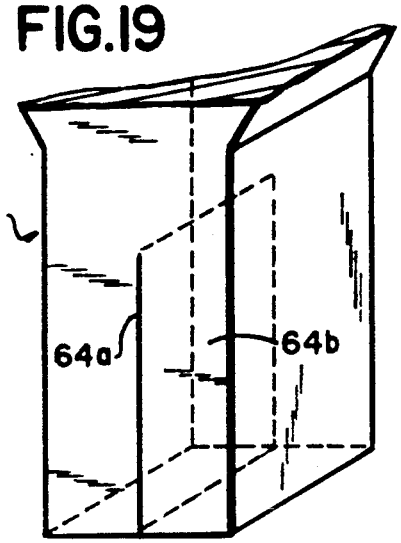
FIG. 19 is a perspective view of a prior art pre-sheared leg designed to avoid asymmetrical splaying.
Figures 20, 21A:
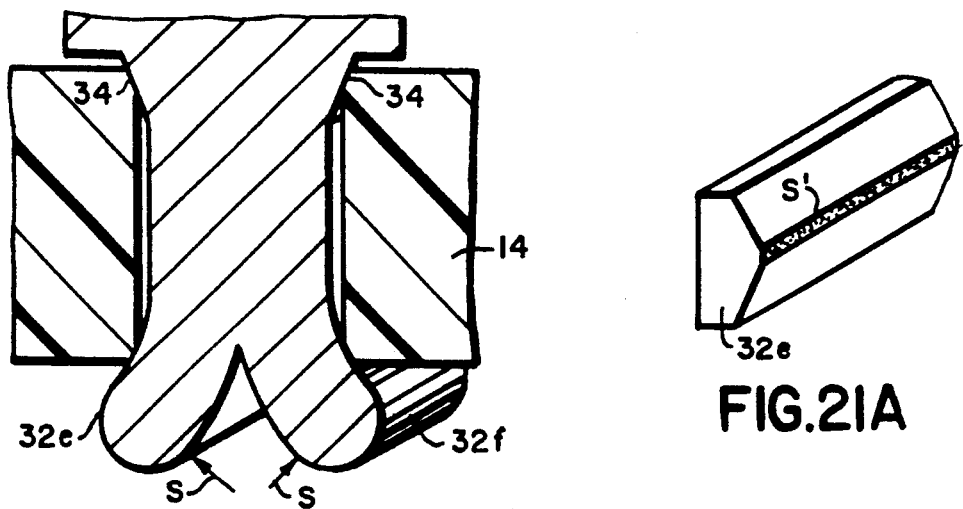
FIG. 20 illustrates details of an asymmetrically splayed leg in accordance with the present invention centered and supported within a hole of a printed circuit board.
FIG. 21A is a fragmented portion of a mounting leg, illustrating the sheared surface resulting from the splitting of the leg portions in accordance with the present invention.
Figure 21B:
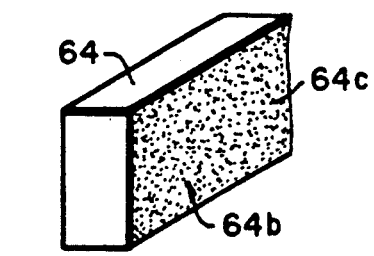
FIG. 21B is similar to FIG. 21A, but showing a leg portion of a pre-sheared leg of the type shown in FIG. 19, showing the significant resulting surface areas which are subject to oxidation.

Referring to FIG. 19, there is shown a mounting leg 64 which is sheared in half by a shear line 64a. Splaying of such a presheared leg assures that the splaying anvil always follows the straight shear line 64a. In such an embodiment, which resulted during the development process, the splaying tool does not do any cutting since the legs are pre-cut. With a 0.003 off center shear line the splaying line was slightly asymmetrical. However, the splaying did not deteriorate because the splay followed the straight shear line and did not get off on a curve like with the coined leg. However, while the pre-sheared leg 64 splayed well and was not sensitive to off center shears, it had one major problem, namely solderability. For good solderability, the terminals must usually be tin plated. It is impossible to plate the sheared surface at the center of the terminal leg because of the very small gap or no gap at all between the leg halves. The resulting sheared unplated surfaces 64b between the two leg halves become oxidized, and in some cases some plating residue or other contamination exists at the sheared areas 64b which prevent good soldering. Referring to FIG. 20, the resulting surfaces S between the leg portions 32e and 32f which are so contaminated or oxidized are not suitable for soldering. This problem of solderability does not exist with the coined legs because the legs are sheared while the terminal is inserted into the PC board hole on the PC board production line just prior to soldering. Therefore, the sheared surface does not have time to become oxidized. Also, only a very small surface S' is sheared, usually 0.005 wide and 0.060 long. In FIG. 21A, the small freshly sheared surface S' of a coined leg half just prior to soldering can be compared and distinguished from the large oxidized surface 64b covered by oxidation 64c of a pre-sheared leg half.

Figure 22:
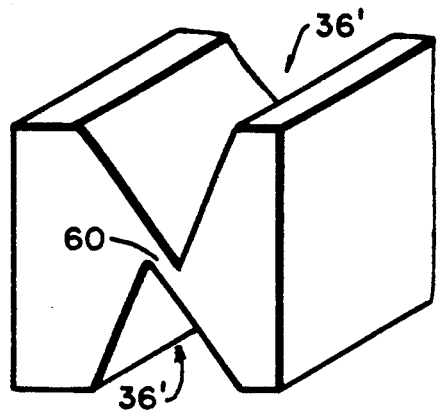
FIG. 22 is a perspective view of the mounting leg shown on FIG. 10, illustrating a cracked region in the web between the coins resulting from excessive stresses during coining.
Figure 23:
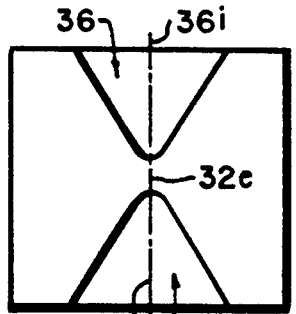
FIG. 23 is similar to FIG. 5, showing v-shaped coins aligned with the center lines of the leg.
Figure 24:
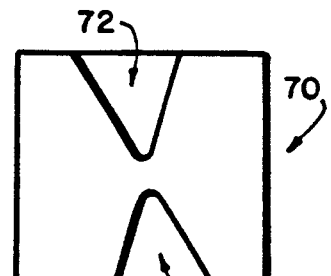
FIG. 24 is similar to FIG. 23, but showing unsymmetrical coins in accordance with the present invention which create the desired stresses in the mounting leg which facilitate the splitting of the leg without cutting by an anvil or splaying tool.

It will therefore be seen that while a pre-sheared leg of the type shown in FIG. 19 has the advantage that it avoids off center or asymmetrical splaying, the mounting legs of this type have the disadvantage in that they are less solderable. The goal of the present invention, therefore, was to develop a coined pin which splays like a pre-sheared pin, but without having a separation between the two halves of the leg. This has been achieved by the use of a special pair of coins which do not have to be sheared with an anvil during the splaying process, and suggested above in the discussion of FIG. 10. Also referring to FIG. 22, a leg coin is shown in which a crack is formed between the two leg halves which develops during the coining process. While this configuration is not desirable because the surface cracked during the coining process will oxidize and will not solder, as would the pre-sheared leg of FIG. 19. However, the embodiment for FIGS. 10 and 22 indicates that the leg can be cracked in half by coining. The presently preferred embodiment is a mounting leg of the type under discussion which is provided with a coin somewhere between the conventional "V" shaped coin illustrated in FIGS. 9 and 23 and a coin which cracks the legs in half, as illustrated in FIGS. 10 and 22. The optimum coin configuration is shown, for example, in FIG. 24, wherein the coining stops just a little short from generating a crack in the leg during the coining process. The material (web 32e) between the tip of the two "V" coin is stressed to the maximum limit, and only a very small force is needed to start a crack. Once the crack is started, it will propagate very rapidly along the stress zone, created by the special coins, even if that initial small force which started the crack is removed. The precise shape of the coin depends on the material, the hardness of the material, and the speed of forming.

If the shape of the coin is not optimum, the leg will either crack during the manufacturing process (FIGS. 10 and 22) or during handling and shipping of the materials or it will not splay straight in the applicator machine (e.g. FIG. 18A), resulting in an out of perpendicular pin mounting position and asymmetrical splay.

Figure 25:
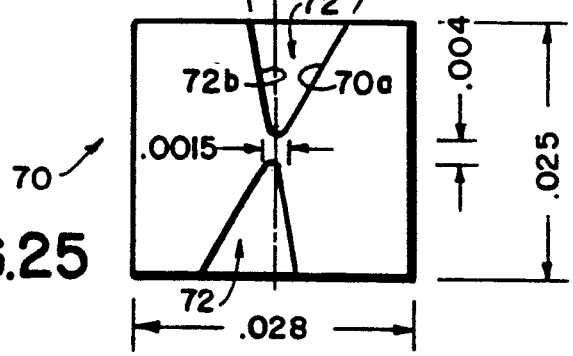
FIG. 25 is similar to FIG. 24, showing details in accordance with the presently preferred embodiment of the invention.

The cross-section shown in FIG. 15 illustrates one example of a presently preferred embodiment dimensioned 0.025 by 0.100 brass #4 hard terminal leg. This terminal splays symmetrically and mounts perpendicular to the PC board, because the splaying anvil does not do any shearing. The anvil just starts to crack. After the crack is started, it will propagate very rapidly on its own upstream of the anvil along the high stressed area between the coins. In FIG. 25, the leg center line is designated by the reference 36i. the coins having surfaces 72a inclined approximately 30 degrees from the leg center line 36i and a second surface 72b inclined ten degrees to the other side of the leg center line 36i. Thus, while the coins 36' in FIG. 22 extend beyond the center of the leg and overlap each other, the offset between the indentations in FIG. 25 is 0.0015, while the offsets are spaced from each other along the leg center line 36i a distance of 0.004.

Figure 26:
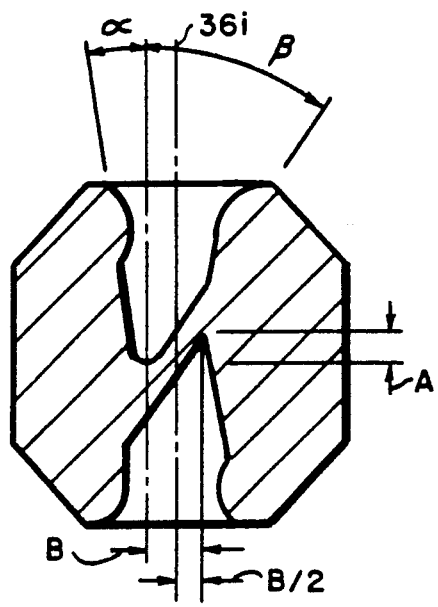
FIG. 26 is similar to FIG. 25, but illustrating a further embodiment of the present invention.
Figure 27:
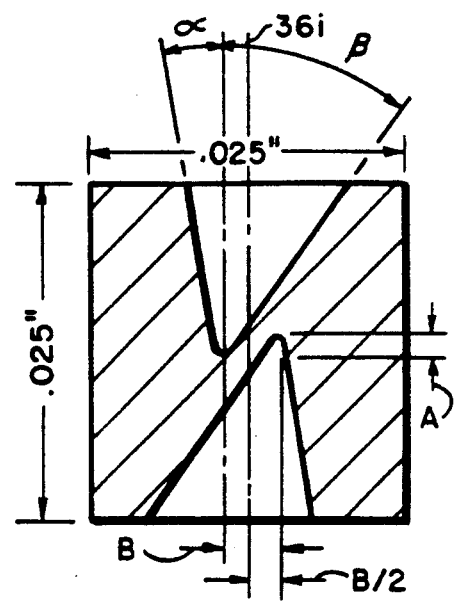
FIG. 27 is similar to FIG. 25, but showing a still further embodiment of the present invention.

FIG. 27 shows the range of dimensions which produce the optimum crack propagation in copper alloys. The angle $\alpha$ can range between 1 degrees–30 degrees, while the angle $\alpha$ can be in the range of between 30 degrees and 40 degrees. The dimension B, which defines the spacing between the indentation or coin lines can range between 0–0.005 inches, while the dimension A, which determines the extent of overlap of the coins can vary from 0 or no overlap to 0.005 inches overlap. The indentations can also be spaced from each other up to 0.005 inches, in which case there is no overlap. These dimensions apply to the slightly rectangular 0.32 inch by 0.05 inch, 0.025 inch square and 0.045 inch square, and the octagon cross-section as shown in FIG. 26. The octagon configuration results when the four corners are coined on a 45 degree angle to produce an octagon shape or near round shape to make the leg conform better to the round hole. This corner coining is done after the center grooves are made, therefore, some material will bulge into the wide top end as shown. However, this does not effect the brittleness and stress concentration of the center section of the leg.

The method of forming the coins to provide the desired stress characteristics will now be described in connection with FIGS. 28A–28E. The purpose of the coining and cold working process is to provide the necessary stress concentration and material brittleness so that when a crack is started by the splaying anvil it will propagate ahead of the front of the anvil (like splitting wood with a wedge) to insure symmetrical splaying at the center of the terminal leg.

Using copper alloy materials such as Brass (CDA260) and Phosphor Bronze (CDA510) coin mounting legs were formed on terminal legs of 0.025 inches square cross-sections and 0.100–0.200 inches long. However, mounting legs in accordance with the method can cover leg cross-sections of 0.05 square, 0.045 and 0.025 octagon, and 0.032 by 0.050 rectangular cross-sectional mounting legs.

Figure 28A:
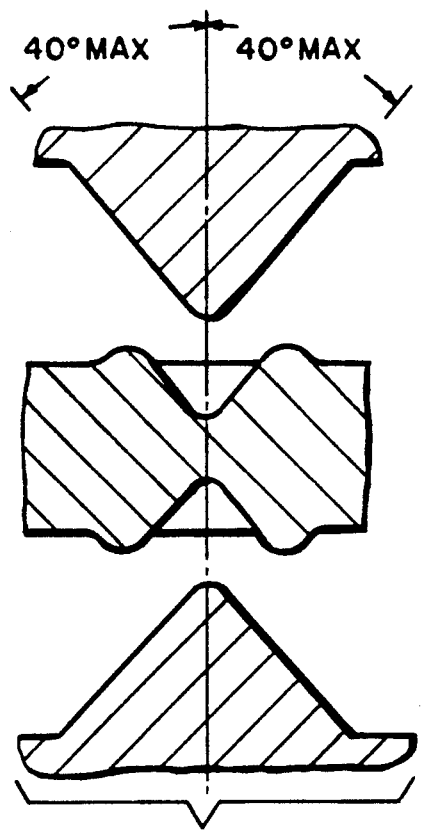
FIGS. 28A-28E illustrate a sequence of steps which can be used to form mounting legs of electrical connectors in accordance with the present invention.

To achieve the necessary stress concentration and brittleness in the center of the terminal leg, the following forming steps may be followed. Referring to FIG. 28A, symmetrical "V" pre-coins are formed extending approximately ⅓ of the material thickness deep. Here, the leg has not yet been cut to width. Such initial coining produces material bulging on the surface as shown. As will be shown, the forming tool has inclined surfaces oriented a maximum of 40 degrees from the center line of the tool, so that the total angle included between the two forming surfaces is a maximum of 80 degrees.

Figure 28B:
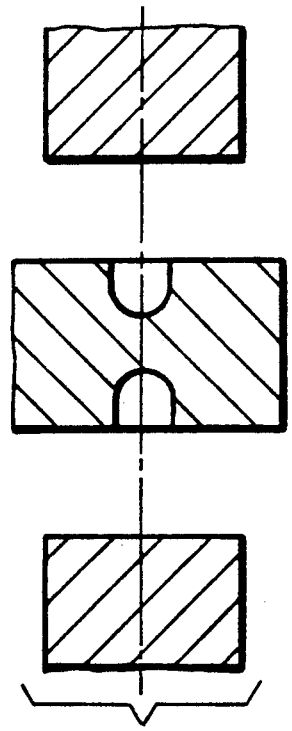

In FIG. 28B, the bulges of the material in the surface are pushed or pressed back by means of flat dyes or presses having surfaces parallel to the surfaces of the sheet material from which the pins are formed. The pressing back of the bulged material causes the resulting grooves to become substantially "U" shaped as shown.

Figure 28C:
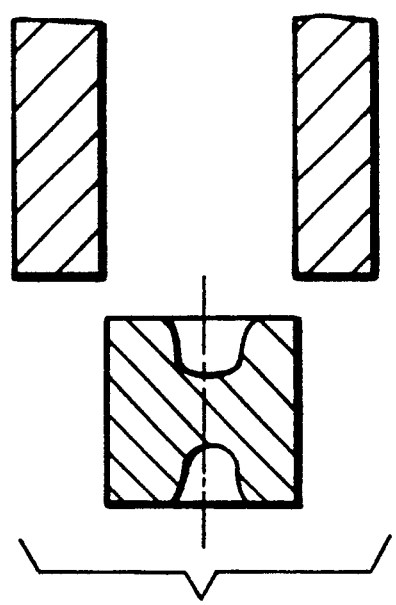
Figure 28D:
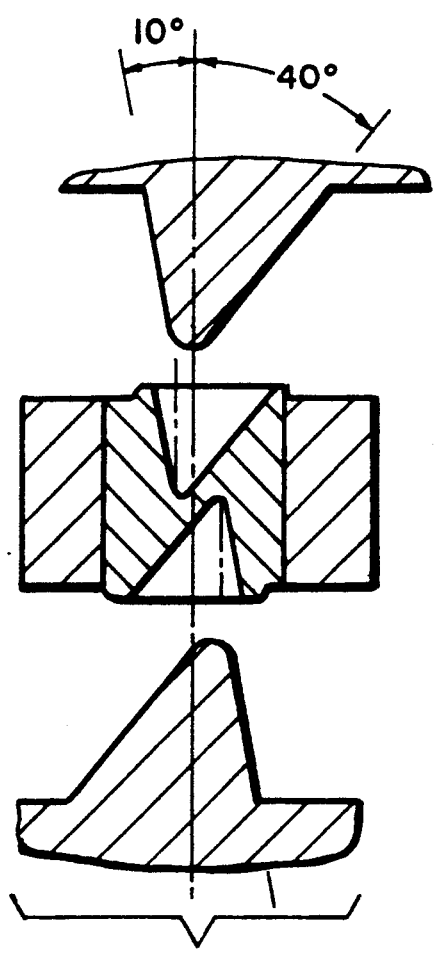
Figure 28E:
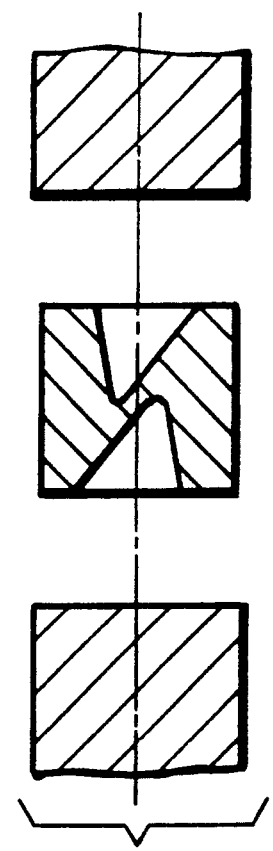

In FIG. 28C, the sheet material is sheared to the desired leg size, by any conventional cutting or shearing tool. In FIG. 28D, the indentations or coins are deepened to make them asymmetrical, while the two sides of the leg are supported. Excess material bulges to the surface as shown on FIG. D. The indentations or coins have configurations of the type shown in FIG. 27. In FIG. 28E, the bulges in the surface are again levelled and thereby the mounting legs are squared. This process not only forms the material to the final shape, but also produces the needed stress concentration and material brittleness at the center section of the leg. The concentrated stresses between the two coined grooves has to be higher than the yield strength, and just below the ultimate tensile strength of the material at the hardest cold work state.

Although preferred embodiments of the invention have been described, it should be understood that various modifications may be made by those skilled in the art without departing from the spirit of the invention. It is the intention, therefore, that the scope of the invention be limited only as indicated by the claims that follow.

What is claimed is:

1. A solid single leg terminal comprising an electrical conductor end portion at one end and an opposing substantially solid mounting end portion for mounting through a hole of a printed circuit board, said mounting end portion forming an elongated mounting leg of substantially uniform cross-section and defining a longitudinal axis, said mounting leg being dimensioned to be substantially freely receivable within the hole from one side of the printed circuit board through to the other side of the printed circuit board, two indentations being provided on opposite sides of said mounting end portion substantially parallel to the longitudinal axis and each defining a frangible line substantially parallel to the longitudinal axis, said frangible lines of said indentations together comprising a frangible web of minimum thickness material, each of said indentations having triangular cross-sections of decreasing dimensions in the direction of said connector end portion in planes normal to said longitudinal axis.

2. A terminal as defined in claim 1, wherein said elongate mounting leg has a substantially uniform rectangular cross-section in planes normal to said longitudinal axis.

3. A terminal as defined in claim 2, wherein said cross-section is square.

4. A terminal as defined in claim 1, further comprising at least one central shoulder intermediate said connector and mounting end portions serving as a stop to limit excessive passage through and fix the position of said mounting leg within the hole.

5. A terminal as defined in claim 4, wherein two central shoulders are provided on opposite sides of the terminal.

6. A terminal as defined in claim 5, wherein a plurality of terminals are connected at said central shoulders to provide a continuous carrier strip from which individual terminals can be severed.

7. A terminal as defined in claim 1, wherein frangible lines of opposite indentations are aligned in a common plane parallel to said axis.

8. A terminal as defined in claim 1, wherein frangible lines of opposite indentations are offset from each other in relation to a plane of symmetry passing through said axis.

9. A terminal as defined in claim 1, wherein the hole in the printed circuit board defines a circular ridge in said one side of the printed circuit board, further comprising intermediate abutment portions on said mounting leg for positioning and aligning said mounting leg in a position to be split and splayed.

10. A terminal as defined in claim 9, wherein said abutment portions comprising, outwardly tapered seats arranged on opposite sides of said mounting leg.

11. A terminal as defined in claim 1, further comprising lead-in coins at the free ends of said mounting leg to reduce the cross-sectional area of said mounting leg at the portion thereof first entering the hole of the printed circuit board thereby facilitating the guidance and insertion of said mounting leg into the hole.

12. A terminal as defined in claim 11, wherein said lead in coins comprise a plurality of tapered surfaces.

13. A terminal as defined in claim 1, wherein said indentations are formed in opposite surfaces of said mounting end portion having pre-determined widths and having maximum width dimensions in said surfaces of said mounting leg which are within the range of approximately 25%-35% of said predetermined width.

14. A terminal as defined in claim 1, wherein the concentrated stresses between said indentations is greater than the yield strength and just below the ultimate tensile strength of the material at the hardest cold worked state.

15. A terminal as defined in claim 1, wherein said mounting leg has an octagonal cross-section to facilitate insertion thereof into a circular hole of a printed circuit board.

16. A terminal as defined in claim 1, wherein a plurality of like terminals are provided connected end-to-end, each two adjacent terminals being connected at a frangible connecting portion sufficiently flexible to permit the coiling of a string or series of terminals on a spool on which said terminals can be stored and from which the terminals can be dispensed.

17. A method of coining a solid single leg terminal having a rectangular cross-section comprising the steps of pre-coining a pair of opposite surfaces of the leg with substantially V-shaped indentations substantially aligned along a line normal to said opposite leg surfaces; deepening said indentations while supporting the other pair of opposite surfaces to prevent widening of the leg, said indentations being formed about said normal line; and pressing any resulting bulging to produce a leg of substantially rectangular cross-section.

18. A method as defined in claim 17, wherein said step of deepening comprises the step of forming the indentations to produce stresses between the two opposite coined indentations higher than the yield strength of the terminal material just below the ultimate tensile strength of the material at the hardest cold worked state.

19. A method as defined in claim 17, further comprising the step of shearing pre-coined portions from a continuous strip of material.

20. A method of coining a solid single leg terminal having a rectangular cross-section comprising the steps of precoining a pair of opposite surfaces of the leg with substantially V-shaped indentations each offset to a side of a line normal to said opposite leg surfaces; depending said indentations while supporting the other pair of opposite surfaces to prevent widening of the leg, said indentations being formed on opposite sides of said normal line; and pressing any resulting bulging to produce a leg of substantially rectangular cross-section whereby said indentations are formed assymetrically about said normal line.

* * * * *